Feb. 2, 1971 M. B. PANISH ET AL 3,560,276
TECHNIQUE FOR FABRICATION OF MULTILAYERED SEMICONDUCTIVE STRUCTURE
Filed Dec. 23, 1968 2 Sheets-Sheet 1

INVENTORS M. B. PANISH
S. SUMSKI
BY Edward M. Fink
ATTORNEY

United States Patent Office 3,560,276

Patented Feb. 2, 1971

3,560,276

TECHNIQUE FOR FABRICATION OF MULTI-LAYERED SEMICONDUCTOR STRUCTURE

Morton B. Panish, Springfield, and Stanley Sumski, New Providence, N.J., assignors to Bell Telephone Laboratories, Incorporated, Murray Hill and Berkeley Heights, N.J., a corporation of New York Filed Dec. 23, 1968, Ser. No. 786,226

Int. Cl. H01l *7/38*

U.S. Cl. 148—171 4 Claims

ABSTRACT OF THE DISCLOSURE

A solution epitaxy technique is employed for the growth of a multilayered structure including a pair of semiconductive regions having different bandgaps with a p-n junction located in the narrow bandgap region. Structures so grown manifest lasing action at higher temperatures and lower threshold currents per unit cross-section than have been attainable heretofore.

Figure 1:
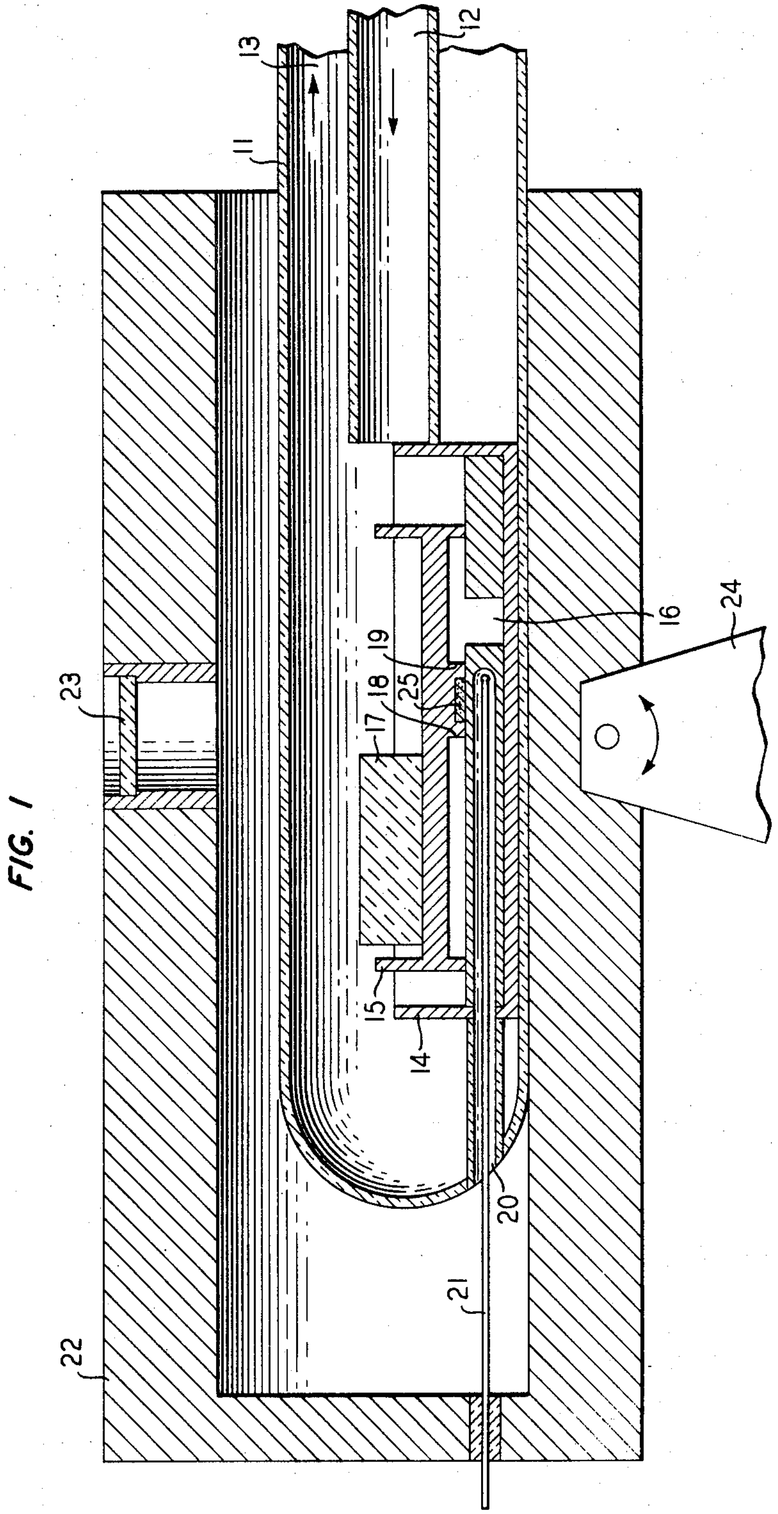

This invention relates to a solution epitaxy technique for the growth of Group III(*a*)–V(*a*) compounds of the Periodic Table of the Elements. More particularly, the present invention relates to a solution epitaxy technique for the growth of a multilayer Group III(*a*)–V(*a*) structure including an epitaxial film of gallium aluminum arsenide, deposited upon an n-type substrate having a p-type diffused region therein, such a structure being of particular interest for use as a junction laser.

Recently, there has been a birth of interest in a class of devices commonly termed "junction lasers" operating continuously over a temperature range of from 250°–300° K. (room temperature). Unfortunately, efforts to fabricate such devices have not met with success, such being attributed to the fact that the threshold current density ($J_{th}$) for lasing has been of the order of 25,000 amperes per square centimeter or greater, so resulting in overheating of the device.

More lately, it has been theorized that such deficiencies could be successfully obviated and satisfactory threshold densities attained in a structure wherein a preponderance of the recombination of holes and electrons is effected in a restricted region of said structure. It was believed that such a restricted region could be realized by situating the recombination region adjacent to and on the p-side of a p-n junction, said recombination region evidencing a narrower effective bandgap than either the n-side or the remainder of the p region. Accordingly, workers in the art have focused their attention upon the development of a technique suitable for the growth of such structures.

In accordance with the present invention, this end is attained by a solution epitaxy technique wherein epitaxial films of gallium-aluminum-arsenide doped with a p-type material are grown upon an n-type gallium arsenide substrate, the p-type dopant being diffused during or subsequent to growth into the substrate from the grown layer to form a p-n junction therein. The resultant structure includes a pair of semiconductive regions having different bandgaps with a p-n junction located in the narrow bandgap region and separated from the phase boundary by a distance less than the diffusion length of minority carriers, thereby defining an intermediate region between the junction and the phase boundary. Devices of the type described manifest lasing action at higher temperatures and lower threshold currents per unit cross-section than have been attainable theretofore, radiative electron-hole recombination occurring between the conduction and valence bands.

Briefly, the inventive procedure involves growth by solution epitaxy in a tipping apparatus including a movable substrate holder adapted with means for removing deleterious oxide contaminants from the surface of a source solution prior to growth. In the operation of the process, a gallium-arsenide wafer is deposited upon a source solution cleaned as noted, and epitaxial growth effected thereon. During the course of the process, an epitaxial film containing a p-type dopant is grown upon the substrate and during growth and subsequent thereto, diffusion of the p-type dopant into the n-type substrate is effected, so resulting in the formation of a p-n junction in the substrate.

The invention will be more readily understood by reference to the following detailed description taken in conjunction with the accompanying drawing wherein:

FIG. 1 is a front elevational view, partly in cross-section, of an apparatus employed in the practice of the invention; and FIGS. 2A through 2D are cross-sectional views in successive stages of manufacture of a junction laser fabricated in accordance with the present invention.

With further reference now to FIG. 1, there is shown a typical crystal growth apparatus utilized in the practice of the present invention. Shown in the figure is a crystal growth tube 11, typically comprised of fused silica having an inlet 12 and an outlet 13 for the introduction and removal of gases, respectively, and a boat assembly 14. Boat 14 has disposed therein a movable substrate holder 15, a well 16 for containing a source solution, and means 17 for actuating holder 15. Holder 15 is also adapted with means 18 and 19 for removing oxides and associated contaminants from the surface of the source solution contained in well 16. The apparatus also contains a thermocouple well 20 and thermocouple 21 for determining the temperature of the system. Tube 11 is shown inserted in furnace 22 adapted with a viewing port 23, furnace 22 being positioned upon cradle 24 which permits tipping of the growth tube.

Figure 2A:
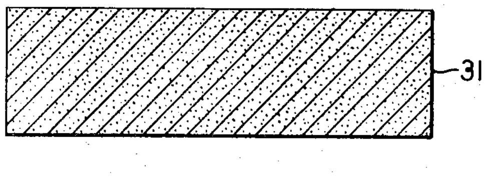
Figure 2B:
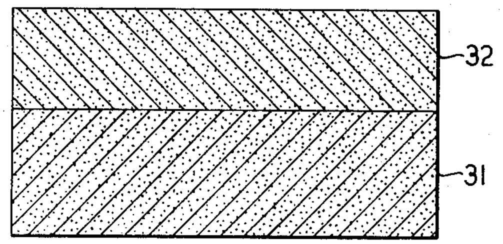
Figure 2C:
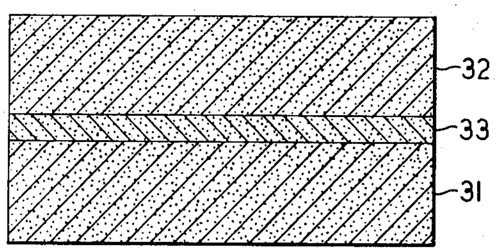
Figure 2D:
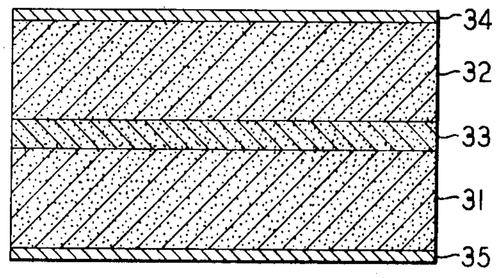

Referring now to an exemplary technique, a suitable n-type gallium arsenide substrate material is obtained, typically from commercial sources. For the purposes of the present invention, the substrate member selected evidences a carrier concentration within the range of $$3\times10^{18}–1\times10^{19}$$

electrons per cubic centimeter. Selection of a material containing less than $3\times10^{18}$ electrons per cubic centimeter has been found to result in unsatisfactory threshold current densities. The maximum carrier concentration is dictated by practical considerations. The material so obtained is next lapped and cleaned in accordance with conventional techniques to yield suitable surfaces. A cross-sectional view of a typical substrate member is shown in FIG. 2A.

Next, an apparatus similar to that shown in FIG. 1, including a quartz growth tube and a carbon boat is selected. Following, a source solution, typically consisting of gallium, aluminum, arsenic, and zinc is prepared. This end is attained by adding known quantities of solid gallium arsenide (99.9999% purity), obtained from commercial sources, to know quantities of gallium (99.9999% purity) and heating the resultant mixture in a pure hydrogen atmosphere to a temperature sufficient to completely dissolve the gallium arsenide. The solution is then cooled and the requisite amount of aluminum and zinc are added so as to result in a solution of the desired composition upon subsequent heating. For the purposes of the present invention, the amount of aluminum employed should be greater than about 0.05 atomic percent in the resultant solution and the amount of zinc may range from approximately 0.1–1 atomic percent. The amounts of gallium, gallium arsenide, and aluminum are dictated by considerations related to the gallium-aluminum-arsenic ternary phase diagram, whereas the quantity of dopant employed is dictated solely by the doping level desired in the diffused region of the resultant structure.

The components of the solution are next placed in the well of the apparatus which is designed so that the upper surface of the solution is slightly above the edge of the well, the components being mixed and dissolved during subsequent heating. Then, the substrate member is inserted in the substrate holder (shown as 25 in FIG. 1) and the system flushed with nitrogen. After flushing the system, prepurified hydrogen is admitted thereto and the temperature elevated to a value within the range of 700–1100° C. depending upon the composition of the solution selected, the temperature of the apparatus having been elevated to a temperature within the range of 750–1100° C. After attaining the maximum temperature, the system is cooled at a predetermined rate and upon reaching the desired tipping temperature, the ram of the apparatus is activated by tipping the boat, thereby causing the leading edge of the substrate holder to remove the oxide scum from the surface of the solution contained in the well and causing deposition of the substrate upon a clean oxide free solution. A controlled cooling program with or without annealing is then initiated at a rate dictated by the depth and distribution of p-type dopant which it is desired to diffuse into the gallium arsenide substrate wafer. Diffusion of the dopant occurs during the cooling cycle concurrently with a growth of the epitaxial film. Diffusion may also be effected during an optional annealing step which may be employed prior to or subsequent to attaining room temperature. The annealing involves maintaining the substrate member at a temperature within the range of 800–1000° C. for a time period of at least one hour, thereby enhancing diffusion. The film 32, so grown, may be seen by reference to FIG. 2B and the intermediate region 33 resulting from the diffusion of the p-type dopant into the n-type substrate by reference to FIG. 2C.

As indicated, diffusion may be continued after epitaxial growth has ceased by maintaining the system at a temperature below the tipping temperature for at least one hour. However, this step is optional and it will be understood that structures evidencing the desirable properties alluded to hereinabove may be obtained by slow cooling during layer growth without annealing or by rapid cooling during growth with subsequent annealing. An example of the present invention is set forth below.

EXAMPLE

This example describes the fabrication of a low threshold p-n junction laser utilizing zinc-doped gallium-aluminum-arsenide grown in accordance with the invention.

A tin doped gallium-arsenide wafer with $4.2 \times 10^{18}$ electrons per cubic centimeter having faces perpendicular to the <111> direction, obtained from commercial sources, was selected as a substrate member. The wafer was lapped with 305 Carborundum, rinsed with deionized water, and etch-polished with a bromine-methanol solution to remove surface damage. Following, a gallium-aluminum-arsenic-zinc solution was prepared from 3.84 milligrams aluminum, 200 milligrams gallium arsenide, 1 gram of gallium, and 10 milligrams of zinc in the manner described above. The substrate member was then inserted in the substrate holder of the apparatus. Next, the system was sealed and nitrogen admitted thereto for the purpose of flushing out entrapped gases. Following, hydrogen was passed through the system and the temperature thereof elevated to approximately 1040° C. and the ram of the apparatus activated by tipping the boat, thereby resulting in the removal of the oxide scum from the surface of the source solution and the substrate member deposited thereon. At this point, a controlled cooling program at 5° C. per minute was initiated and the solution cooled to approximately 900° C., thereby resulting in the formation of an epitaxial film of p-type gallium-aluminum-arsenide with the approximate composition $$Ga_{.5}Al_{.5}As$$

upon the gallium arsenide substrate and the concurrent diffusion of zinc into the substrate, the resultant epitaxial film having a thickness of approximately 1.5 mils. Then the apparatus was tipped in the other direction and the gallium arsenide substrate bearing the p-type layer of gallium-aluminum-arsenide was again moved by actuating the ram of the apparatus and removed from the surface of the solution. The controlled cooling program was then stopped and the apparatus held at 900° C. for approximately 3 hours to permit the completion of the zinc diffusion and the adjustment of the zinc concentration profile. In this manner, a p-n junction depth below the phase boundary of approximatel 1.6 microns was obtained. The system was then cooled by removal of the entire apparatus from the furnace.

A non-heat-sinked laser diode was then prepared from the heterostructure so obtained for the purpose of evaluating the threshold current density. This end was attained by initially lapping the substrate member to approximately 6 mils and the gallium-aluminum-arsenide layer to approximately 0.5 mil. The p-type gallium-aluminum-arsenide was then coated with about 5000 A. of gold 34 by conventional evaporation techniques. Contact to the n-type substrate was made by depositing $1 \times 10^4$ A. of tin 35 thereon. The resultant structure was cut and cleaved to form a number of diodes which were then mounted on holders adapted with means for contacting both the n and p sides of the structures, the resultant structure being seen in cross-section in FIG. 2D.

The resultant laser diodes were mounted in a microscope fitted for observation of infrared light and powered by a pulsed power supply attached to the described contacts. At room temperatures, the threshold current density for such diodes ranged from approximately 9,000 to about 12,000 amperes per square centimeter.

What is claimed is:

1. A method for the growth of a semiconductor material including contiguous first and second semiconductive regions having different bandgaps, a phase boundary between said regions and a p-n junction in the narrower bandgap region comprising the steps of (a) inserting a gallium arsenide wafer in a crystal growth apparatus including a movable substrate holder having means for removing contaminants from the surface of a source solution, (b) placing a source solution in said apparatus consisting of gallium, gallium arsenide, aluminum, and zinc, (c) heating said source solution to a temperature within the range of 700°–1100° C., (d) tipping the said substrate holder thereby removing contaminants from the surface of said source solution and depositing said substrate thereon, and (e) initiating a controlled cooling program which results in the growth of an epitaxial film upon said substrate and the diffusion of zinc into the said substrate to form an active p-type region therein.

2. Method in accordance with claim 1 wherein said source solution comprises from approximately 0.1 to 1 atom percent of said p-type dopant.

3. Method in accordance with claim 1 wherein said substrate member is maintained at a temperature within the range of 800°–1000° C. for at least one hour prior to attaining room temperature.

4. A method for the fabrication of a semiconductor injection laser device including contiguous first and second semiconductive regions having different bandgaps, a phase boundary between said region and a p-n junction in the narrower bandgap region, separated from said phase boundary by a distance less than the diffusion length of minority carriers, whereby there is defined an intermediate region between said junction and said boundary comprising the steps of (a) inserting a gallium arsenide wafer having a carrier concentration within the range of $3\times10^{18}$–$1\times10^{19}$ electrons/cm.$^3$ in a crystal growth apparatus including a movable substrate holder having means for removing contaminants from the surface of a source solution, (b) placing a source solution in said apparatus consisting of gallium, gallium arsenide, aluminum, and zinc, (c) heating said source solution to a temperature within the range of 700°–1100° C., (d) tipping the said substrate holder, thereby removing contaminants from the surface of said source solution and depositing said substrate thereon, and (e) initiating a controlled cooling program which results in the growth of an epitaxial film upon said substrate and the diffusion of zinc into the said substrate to form an active p-type region therein, and forming ohmic contacts upon said substrate member and said p-type gallium-aluminum-arsenide epitaxial film, respectively.

References Cited

UNITED STATES PATENTS

| | | | |
|---|---|---|---|
| 3,158,512 | 11/1964 | Nelson et al. | 148—1.5 |
| 3,447,976 | 6/1969 | Faust et al. | 148—1.5 |
| 3,463,680 | 8/1969 | Melngailis et al. | 148—172 |

L. DEWAYNE RUTLEDGE, Primary Examiner

E. L. WEISE, Assistant Examiner

U.S. Cl. X.R.

148—172